US009960509B2

(12) United States Patent
Sterling et al.

(10) Patent No.: US 9,960,509 B2
(45) Date of Patent: *May 1, 2018

(54) POWER TOOL WITH LIGHT UNIT

(71) Applicant: BLACK & DECKER INC., New Britain, CT (US)

(72) Inventors: Brian Sterling, Jarrettsville, MD (US); Stephen P. Osborne, Baltimore, MD (US); Paul S. White, Fallston, MD (US); Jeff Delcamp, Baltimore, MD (US)

(73) Assignee: Black & Decker Inc., New Britain, CT (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/664,322

(22) Filed: Jul. 31, 2017

(65) Prior Publication Data

US 2017/0373415 A1 Dec. 28, 2017

Related U.S. Application Data

(63) Continuation of application No. 13/079,158, filed on Apr. 4, 2011, now Pat. No. 9,722,334.

(Continued)

(51) Int. Cl.
*H01R 12/70* (2011.01)
*H05B 33/08* (2006.01)
(Continued)

(52) U.S. Cl.
CPC .......... *H01R 12/7005* (2013.01); *B25F 5/02* (2013.01); *B25F 5/021* (2013.01); *G01R 31/362* (2013.01);
(Continued)

(58) Field of Classification Search
CPC ......... B25B 23/18; B25B 21/00; B25B 21/02; B25B 13/481; B25B 23/00; H05B 37/00;
(Continued)

(56) References Cited

U.S. PATENT DOCUMENTS 2,130,166 A 2/1943 Way
2,525,568 A 10/1950 Cameron et al.
(Continued)

FOREIGN PATENT DOCUMENTS

DE 2529668 A1 1/1977
DE 8521614.3 U1 1/1986
(Continued)

OTHER PUBLICATIONS

David, Radu—Extended European Search Report—Nov. 14, 2016—7 pages—The Hague.
(Continued)

*Primary Examiner* — Alexander H Taningco
*Assistant Examiner* — Renan Luque
(74) *Attorney, Agent, or Firm* — Scott B. Markow

(57) ABSTRACT

A power tool includes a housing coupled to an electrical power source, a motor contained in the housing, and a motor control circuit that controls output speed of the motor. A light nut is coupled to the housing to illuminate a work surface. A light unit control circuit controls illumination of the light, unit. A switch unit is coupled to the housing and selectively operable to control the operation of the motor control circuit and the light unit control circuit. The light unit control circuit includes a timer configured to cause the light unit to illuminate a first brightness level when the switch unit is actuated, and to remain illuminated at the first brightness level for a predetermined time period after the trigger is (Continued)

actuated. The predetermined time period restarts if the switch unit is not deactivated before the end of the predetermined time period.

15 Claims, 16 Drawing Sheets

Related U.S. Application Data

(60) Provisional application No. 61/321,699, filed on Apr. 7, 2010.

(51) Int. Cl.

| | | |
|---|---|---|
| G01R 31/36 | (2006.01) | |
| B25F 5/02 | (2006.01) | |
| H01R 13/11 | (2006.01) | |
| H02J 7/00 | (2006.01) | |
| H02P 3/08 | (2006.01) | |
| H02P 7/285 | (2016.01) | |
| H01H 9/06 | (2006.01) | |
| H01M 10/44 | (2006.01) | |
| H01M 10/48 | (2006.01) | |
| H02J 7/04 | (2006.01) | |
| H02P 7/29 | (2016.01) | |
| H02P 31/00 | (2006.01) | |
| H01M 10/42 | (2006.01) | |

(52) U.S. Cl.
CPC ..... *G01R 31/3627* (2013.01); *G01R 31/3675* (2013.01); *H01H 9/061* (2013.01); *H01M 10/441* (2013.01); *H01M 10/482* (2013.01); *H01R 13/112* (2013.01); *H02J 7/0003* (2013.01); *H02J 7/007* (2013.01); *H02J 7/0008* (2013.01); *H02J 7/0019* (2013.01); *H02J 7/0021* (2013.01); *H02J 7/0031* (2013.01); *H02J 7/0047* (2013.01); *H02J 7/0063* (2013.01); *H02J 7/045* (2013.01); *H02P 3/08* (2013.01); *H02P 7/285* (2013.01); *H02P 7/29* (2013.01); *H05B 33/0806* (2013.01); *G01R 31/3682* (2013.01); *H01H 2009/065* (2013.01); *H01M 2010/4271* (2013.01); *H01M 2010/4278* (2013.01); *H01M 2220/30* (2013.01); *H02J 2007/004* (2013.01); *H02J 2007/0067* (2013.01); *H02P 31/00* (2013.01)

(58) Field of Classification Search
CPC .... H05B 33/08; H05B 39/042; H05B 39/085; Y10T 408/65; Y10T 83/828; Y10S 362/802; Y10S 315/04; Y10S 362/804; Y10S 388/903; Y10S 388/909; Y10S 388/93; Y10S 388/937; B25F 5/021; B25F 5/00; F21Y 2101/02; B25H 1/0092; F21L 14/00; F21L 14/02; F21L 4/027; F21V 21/084; F21V 21/30; F21V 23/02; F21V 23/0414; F21V 23/0442; F21V 29/004; F21V 29/74; F21V 5/04
USPC ............... 315/307, 362, 291, 360; 408/4; 439/628; 173/217, 170; 362/119
See application file for complete search history.

(56) References Cited

U.S. PATENT DOCUMENTS

| | | | |
|---|---|---|---|
| 2,822,615 | A | 2/1958 | Durst et al. |
| 3,919,541 | A | 11/1975 | Chao |
| 3,977,278 | A | 8/1976 | Jackson |
| 4,513,381 | A | 4/1985 | Houser et al. |
| 4,587,459 | A | 5/1986 | Blake |
| 4,642,738 | A | 2/1987 | Meller |
| 5,169,225 | A | 12/1992 | Palm |
| 5,412,546 | A | 5/1995 | Huang |
| 5,473,519 | A | 12/1995 | McCallops |
| 5,530,301 | A | 6/1996 | Fu et al. |
| 6,318,874 | B1 | 1/2001 | Matsunaga |
| 6,494,590 | B1* | 12/2002 | Paganini ............... B25F 5/021 362/109 |
| 6,496,590 | B2 | 12/2002 | Hornick et al. |
| 6,511,200 | B2 | 1/2003 | Matsunaga |
| 6,533,432 | B1 | 3/2003 | Alender |
| 6,774,582 | B1 | 8/2004 | Kwong et al. |
| 7,185,998 | B2 | 3/2007 | Oomori et al. |
| 2002/0048166 | A1* | 4/2002 | Matsunaga ............ B25F 5/021 362/119 |
| 2002/0085372 | A1 | 7/2002 | Lehrer |
| 2004/0174699 | A1 | 9/2004 | Minalga |
| 2006/0193705 | A1 | 8/2006 | Campbell |
| 2008/0018256 | A1 | 1/2008 | Snyder |
| 2008/0059089 | A1* | 3/2008 | Hornick ................ H02J 7/0063 702/63 |
| 2008/0074865 | A1 | 3/2008 | Lutz |
| 2009/0235544 | A1 | 9/2009 | Spaulding |
| 2009/0309519 | A1* | 12/2009 | Suzuki .................. B25F 5/021 315/314 |
| 2010/0141153 | A1* | 6/2010 | Recker ............... H05B 33/0803 315/149 |

FOREIGN PATENT DOCUMENTS

| | | |
|---|---|---|
| DE | 3738563 A1 | 5/1989 |
| DE | 3831344 A1 | 3/1990 |
| EP | 1072842 A2 | 1/2001 |
| EP | 1477282 A1 | 11/2004 |
| FR | 2523891 | 9/1983 |
| GB | 2305128 | 4/1997 |
| JP | 40342 A | 1/1965 |
| JP | 58-164199 U1 | 11/1983 |
| JP | 6444064 A | 2/1989 |
| JP | 1117882 U1 | 8/1989 |
| JP | 11111002 A2 | 4/1990 |
| JP | 2512328 Y | 8/1991 |
| JP | 549283 | 6/1993 |
| JP | 5274969 A | 10/1993 |
| JP | 2512328 B2 | 7/1996 |
| JP | 1034564 A | 2/1998 |
| JP | 1044064 A | 2/1998 |
| JP | 2001300867 A2 | 10/2001 |
| WO | 9902310 A2 | 1/1999 |

OTHER PUBLICATIONS

Chen, Sibin—Office Action re: U.S. Appl. No. 13/475,002—dated Apr. 9, 2015—8 pages—Alexandria, Virginia.
European Search Report re: related application No. EP11161567.
Machine Translation of JP58-164199-U1.

* cited by examiner

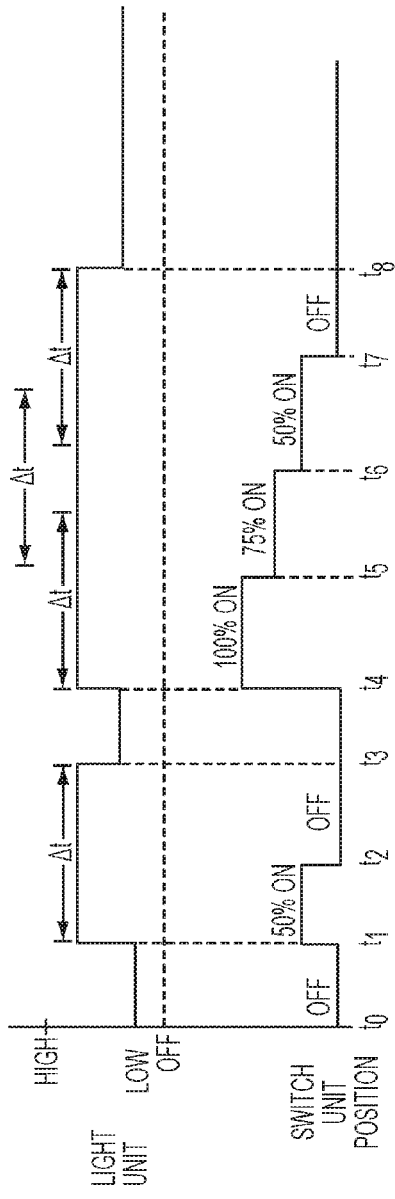
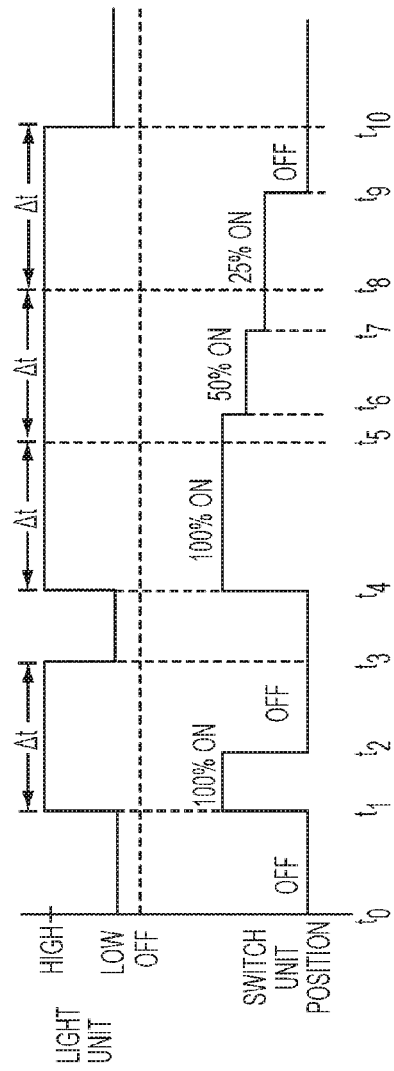

POWER TOOL WITH LIGHT UNIT

CROSS REFERENCE TO RELATED APPLICATIONS

This application is a continuation of U.S. patent application Ser. No. 13/079,158, filed Apr. 4, 2011, tiled "Power Tool with Light Unit," which claims priority, under 35 U.S.C. § 119(e), to U.S. Provisional Application No. 61/321,699 filed Apr. 7, 2010, titled "Condition Monitoring Power Tool Assembly" each of which is incorporated herein by reference.

TECHNICAL FIELD

The present application relates generally to handheld power tools. More particularly, the present application relates to handheld power tools having a light configured to shine onto a workpiece machined by the power tool.

BACKGROUND

Power tools are often used in a variety of conditions ranging from well-lit indoor work spaces to outside construction sites or other areas that are not always well-lit. Accordingly, it can be desirable to provide a method or apparatus that permits a power tool to have a lighting feature that will illuminate the workpiece that is being worked on by the power tool. Such a lighting feature will assist a user to be able to adequately see the workpiece or work area that is being worked on by the power tool even in substandard light conditions. It can also be desirable for such a light unit to remain lit even when the power tool is not being operated so that the power tool can be used like a flashlight, or so that the user can easily find a power tool in a darkened room or tool bag.

SUMMARY

In an aspect, a power tool includes a housing able to be coupled to an electrical power source. A motor is contained in the housing and connectable to the power source by a motor control circuit configured to control output speed of the motor. A light unit is coupled to the housing, configured to illuminate a work surface, and connectable to the power source by a light unit control circuit configured to control illumination of the light unit. A switch unit is coupled to the housing and selectively operable by the user to control the operation, of the motor control circuit and the light unit control circuit. The light unit control circuit causes the light unit to illuminate at a first brightness level when the switch unit is actuated, and at a second brightness level when the switch unit is released, the second brightness level being less than the first brightness level.

Implementations of this aspect may include one or more of the following features. The light unit control circuit may include a first resistor and a second resistor wired in parallel between the power source and the light unit, the second resistor having greater resistance than the first resistor, so that current is permitted to flow through the first resistor when the switch unit is actuated and current is prevented from flowing through the first resistor when the switch unit is released. The resistance of the second resistor may be at least approximately one hundred times the resistance of the first resistor. The light control circuit may include a light unit switch that closes to cause current to flow through the first resistor when the switch unit is actuated, and that opens to prevent current from flowing through the first resistor when the switch unit is released. The light unit switch may include one of an electronic switch or electromechanical switch that is closed by actuation of the switch unit. The light unit control circuit may include a timer configured to cause the light unit switch to remain closed a predetermined amount of time after the switch unit is one of actuated or released. The timer may include one of a microprocessor, a digital timer circuit or an analog timer circuit. A fader may causes the light unit to gradually fade between the first brightness level and the second brightness level.

In another aspect, a power tool includes a housing able to be coupled to an electrical power source. A motor is contained in the housing and connectable to the power source by a motor control circuit configured to control output speed of the motor. A light unit is coupled to the housing, configured to illuminate a work surface, and connectable to the power source by a light unit control circuit configured to control illumination of the light unit. A switch unit is coupled to the housing and selectively operable by the user to control the operation of the motor control circuit and the light unit control circuit. The light unit control circuit includes a timer configured, to cause the light unit to illuminate a first brightness level when the switch unit is actuated, and to remain illuminated at the first brightness level for a predetermined time period after the trigger is actuated, where the predetermined time period restarts if the switch unit is not deactivated before the end of the predetermined time period.

Implementations of this aspect may include one or more of the following features. The light control circuit may include a light unit switch coupled to the switch unit and the timer, so that the light unit switch closes to cause current to flow to the light unit when the switch unit is actuated, and that opens to prevent current from flowing to the light unit when the predetermined time period expires. The light unit switch may include one of an electronic switch or electromechanical switch that is closed by actuation of the switch unit. The timer may be configured to cause the light unit switch to remain closed a predetermined amount of time after the switch unit is actuated. The timer may include one of a microprocessor, a digital timer circuit or an analog timer circuit. The light unit control circuit may include a fader that causes the light unit to gradually fade between the first brightness level and the second brightness level. The light unit control circuit may cause the light unit to illuminate at a second brightness level that is less than the first brightness level when the switch unit is deactivated and the predetermined time period has expired. The light unit control circuit may further include a first resistor and a second resistor wired in parallel between the power source and the light unit, the second resistor having greater resistance than the first resistor, wherein current is permitted to flow through the first resistor when the switch unit is actuated and current is prevented from flowing through the first resistor when the switch unit is released. The resistance of the second resistor is at least approximately one hundred times the resistance of the first resistor. The light control circuit may further include a light unit switch that closes to cause current to flow through the first resistor when the switch unit is actuated, and that opens to prevent current from flowing through the first resistor when the switch unit is released and the predetermined time period has expired. The switch unit may include a trigger that can travel relative to the housing, and the timer senses a position of the trigger and causes the predetermined time period to restart when the position of the trigger changes without the trigger being deactivated.

In another aspect, a power tool includes a housing able to be coupled to an electrical power source, a tool holder coupled to the housing, and a motor contained in the housing and connectable to the power source by a motor control circuit. The motor control circuit includes a microprocessor configured to control output speed of the motor. A transmission connects the motor to the tool holder, such that rotation of the motor causes rotation of the tool holder. A light unit is coupled to the housing, is configured to illuminate a work surface, and is connectable to the power source by a light unit control circuit. The light unit control circuit includes a first resistor and a second resistor wired in parallel between the power source and the light unit. The second resistor has greater resistance than the first resistor. A transistor is in series with the first resistor and the light unit. A timer connects to a gate of the transistor. A trigger is coupled to the housing, the motor control circuit and the light unit control circuit. The trigger is selectively operable by the user to control the operation of the motor control circuit and the light unit control circuit. When the trigger is actuated, the motor is activated by the microprocessor, and the light unit is illuminated at a first brightness level, and remains illuminated at the first brightness level for a predetermined time period after the switch unit is actuated. The predetermined time period restarts if the trigger remains actuated at the end of the predetermined time period. When the trigger is released, the motor is deactivated by the microprocessor, and the light unit is illuminated at a second brightness level that is less than the first brightness level after the predetermined time period has expired.

Advantages may include one or more of the following. The light may remain on in at a lower brightness level when the tool is not in use to make it easier for a user to locate the tool in a darkened room or in a tool bag. The light may also be on a timer that starts when the tool switch is activated and that restarts when the tool switch changes position and/or if the tool switch is not released when the timer expires to avoid the light timing out and going OFF while the tools is still in operation. These and other advantages and features will be apparent from the description, the drawings, and the claims.

BRIEF DESCRIPTION OF THE DRAWINGS

FIG. 16 is a timing diagram showing one embodiment of the operation of the light unit control circuit of FIG. 15.

FIG. 17 is a timing diagram showing another embodiment of the operation of the light unit control circuit of FIG. 15.

DETAILED DESCRIPTION

Figure 1:
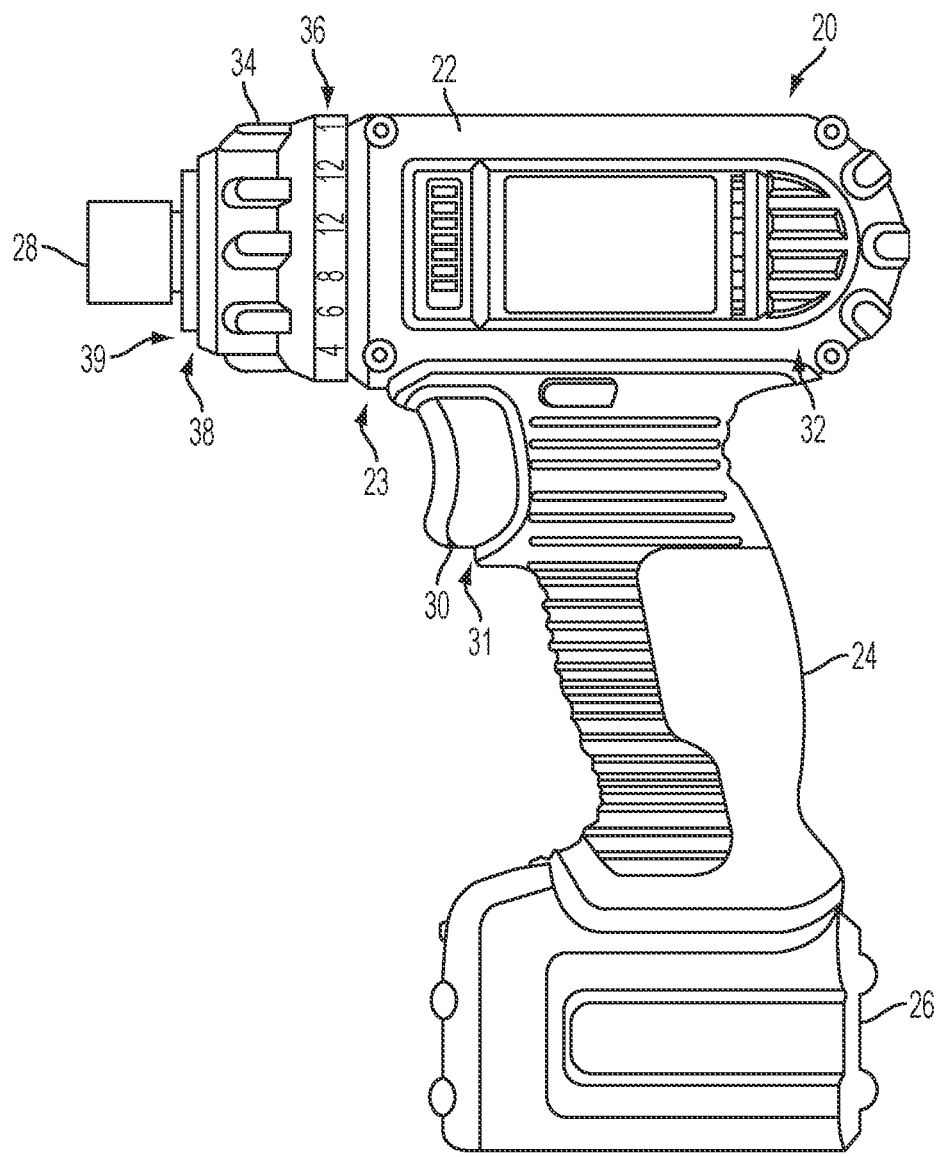
FIG. 1 is a side view of a power tool with a light unit near the tool holder.
Figure 2:
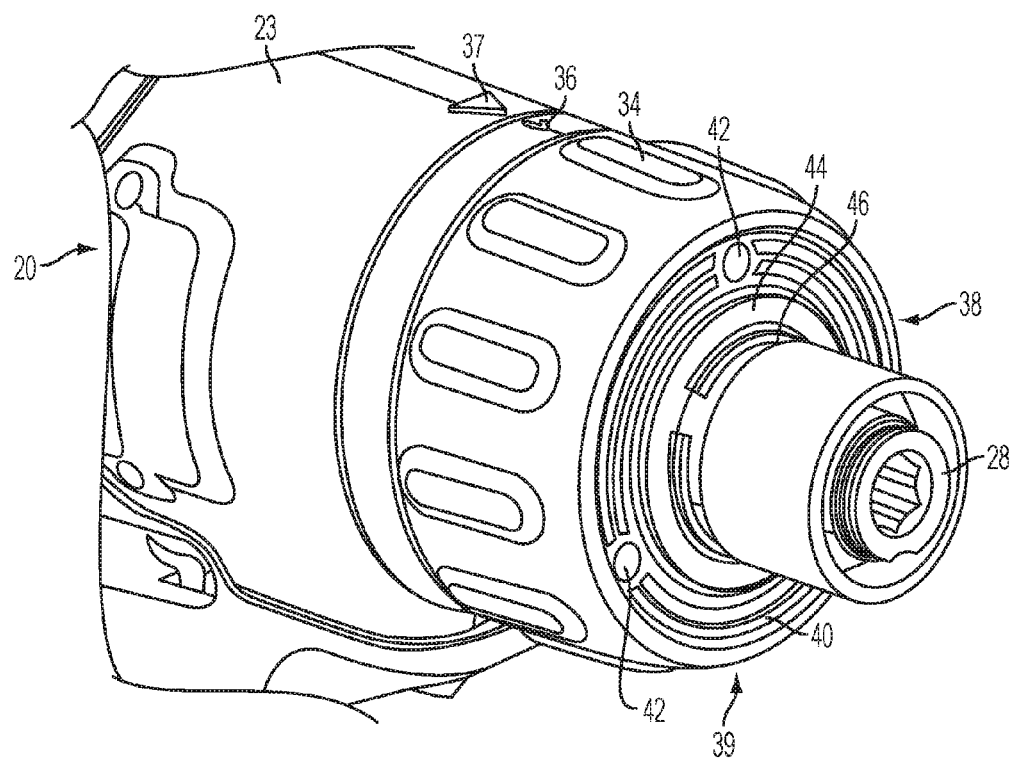
FIG. 2 is a partial perspective view of the light unit of FIG. 1.

FIGS. 1 and 2 illustrate an embodiment of a power tool with a light unit. The power tool, in this case a powered driver 20, has a housing 22 with, e.g., a clam shell type or other suitable type of configuration. The power driver 20 includes a nose portion 23 located at a front portion of the housing 22 and a handle 24 that projects downwardly from the housing 22. Coupled to the bottom of the handle 24 is a battery 26 that provides power to a motor (not shown) disposed inside the housing.

Coupled to the front of the nose portion 23 is an end effector in the form of a quick-release tool holder 28 that is connected to the motor by a transmission (not shown), e.g., a planetary gear transmission, and an output spindle (not shown) that transmits rotational movement of the motor to the tool holder 28. The tool holder 28 is configured to hold an accessory or tool such as a drill bit or a driving type accessory such as a Philips or standard screwdriver bit. Other types of tools or accessories may be held and used in the tool holder 28 as can appreciated by one skilled in the art. Examples of tool holders that may be used in accordance with this embodiment invention may be include quick change tool holders similar to those found on products such, as a DC825KA Impact Driver and a DC815KA Impact Driver that are manufactured and marketed by the DeWalt Industrial Tool Company of Baltimore, Md.

Coupled to the handle 24 just below the housing 22 is a switch unit 31 that includes a trigger 30. The trigger 30 is coupled to one or more electronic switches inside of the switch unit 30 so that movement of the trigger 30 selectively provides power from the battery 26 to the motor, in order to control the speed and/or torque output of the motor. For example, the switch unit 31 may control the motor as described in the aforementioned U.S. Provisional Application No. 61/321,699 to which this application claims priority.

The power driver 20 also includes a clutch collar 34 near the tool holder 28 that may be rotated to adjust the maximum torque output of the transmission. Different angular positions of the clutch collar 34 may provide different amounts of maximum torque to the tool holder 28. A numbered scale 36 may appear on the clutch collar 34 in order to provide a user an indication of the setting of the clutch collar 34. An indicator 37 may be located on the nose portion 23. The indicator 37 may provide a reference for the user for determining the angular position of the clutch collar 34 and a reference point for comparing the numbers on the numbered scale 36. The clutch collar 34 also can provide protection for interior portions of the power driver 20, particularly the transmission and other internal components of the power driver 20 that may be mounted in the nose portion 23.

An example of a clutch and transmission that may work accordance with the invention is shown in U.S. Pat. No. 7,066,691 which is incorporated by reference in its entirety. Of course, other types of collars may be used in accordance with the invention. For example, in some embodiments, a collar near the tool holder may control functions in addition to or instead of a clutch, e.g., drill/hammer mode selection, gear shifting, power on/off, variable speed control, or other rotating collar control mechanisms. This specification refers to the clutch collar as an example but does not limit embodiments in accordance with the invention to tools having clutch collars.

Located on the front portion of the power tool 20 and just behind the tool holder 28 is a light unit 38 configured to illuminate the work surface. The light unit 38 is located within a recess 39 of the clutch collar 34. The light unit 38 includes a plurality of light emitting diodes (LEDs) 42 located at various, points around an annular printed circuit board, which is connected by wires to the switch unit or to a controller, such a microprocessor. While the illustrated embodiment shown in FIG. 2 illustrates three LEDs, any number of LEDs may be used. The light unit also 38 includes a transparent cover 40 that protects interior components of the light unit from moisture and contaminants. The switch unit 30 controls power delivery to and illumination of the LEDs, as described in more detail below.

Figure 3:
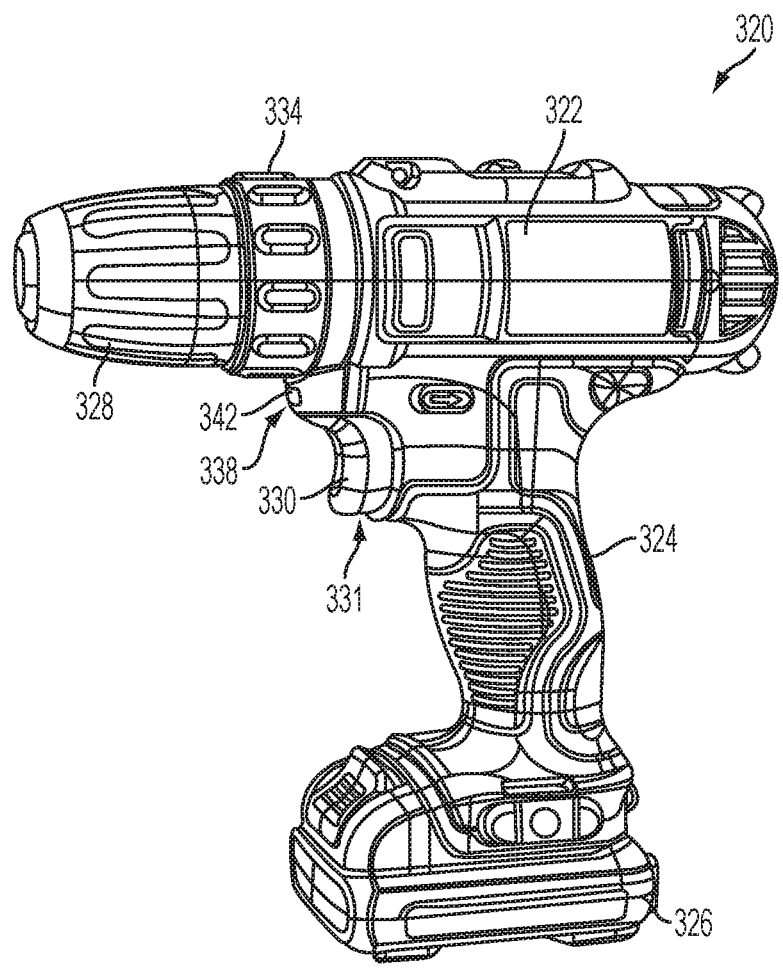
FIG. 3 is a perspective view of a power tool with a light unit above the trigger and below the chuck.

FIG. 3 illustrates an embodiment of a power tool with a light unit. The power tool, in this case a power drill 320, has a housing 322 with, e.g., a clam shell type or other suitable type of configuration, and a handle 324 that projects downwardly from the housing 322. Coupled to the bottom of the handle 324 is a battery 326 that provides power to a motor (not shown) disposed inside the housing.

Coupled to a front of the housing 322 is an end effector in the form of a chuck 328 (e.g., a keyless chuck) that is connected to the motor by a transmission (not shown), e.g., a planetary gear transmission, and an output spindle (not shown) that transmit rotational movement of the motor to the chuck 328. The chuck 328 is configured to hold an accessory or tool such as a drill bit or a driving type accessory such as a Philips or standard screwdriver bit. Other types of tools or accessories may be held and used in the chuck 328 as can appreciated by one skilled in the art. Examples of chucks that may be used in accordance with this embodiment may be a 7000 Series chuck manufactured and marketed by the Jacobs Chuck Manufacturing Company of Clemson, S.C.

Coupled to the handle 324 just below the housing 322 is a switch unit 331 that includes a trigger 330. The trigger 330 is coupled to one or more electronic switches inside of the switch unit 331 so that movement of the trigger 330 selectively provides power from the battery 326 to the motor, in order to control the speed and/or torque output of the motor. For example, the switch unit 331 may control the motor as described in the aforementioned U.S. Provisional Application No. 61/321,699, to which this application claims priority.

The power drill 320 also includes a clutch collar 334 near the chuck 328 that may be rotated to adjust the maximum torque output of transmission. Different angular positions of the clutch collar 334 may provide different amounts of maximum torque to the chuck 328. A numbered scale may appear on the clutch collar 334 in order to provide a user an indication of the setting of the clutch collar 334. An example of a clutch and transmission that may work in accordance with the invention is shown in U.S. Pat. No. 7,066,691 which is incorporated by reference in its entirety. Of course, other types of collars may be used in accordance with the invention. For example, in some embodiments, a collar near the tool holder may control functions in addition to or instead of a clutch, e.g., drill/hammer mode selection, gear shifting, power on/off, variable speed control, or other rotating collar control mechanisms. This specification refers to the clutch collar as an example but does not limit embodiments in accordance with the invention to tools having clutch collars.

Located on the front portion of the housing 322, just above the trigger 330 and just below the chuck 328 and clutch collar 334 is a light unit 338 configured to illuminate the work surface. The light unit 38 includes one or more light emitting diodes (LED) 342 which is connected by wires to the switch unit or to a controller, such a microprocessor. While the illustrated embodiment shown in FIG. 3 illustrates a single LED, any number of LEDs may be used. The LED 342 may also include a transparent cover or lens that protects interior components of the light unit from moisture and contaminants and/or that focuses or redirects the light from the LED 342. The switch unit 331 controls power delivery to and illumination of the LED 342, as described in more detail below.

There are numerous other possible configurations of light units attached to power tools that are within the scope of the claimed invention. For example, the power tools can have the configurations shown in U.S. patent application Ser. No. 12/379,585 (filed Feb. 25, 2009, titled "Light For A Power Tool And Method Of Illuminating A Workpiece"), Ser. No. 12/859,036 (filed Aug. 18, 2010, titled "Power Tool With Light Emitting Assembly"), and Ser. No. 12/895,051 (filed Sep. 30, 2010, titled "Power Tool With A Light For Illuminating A Workpiece"), each of which are incorporated herein by reference. The motors and light units in these and other power tools can be controlled by one or more of the following control circuits.

Figure 4:
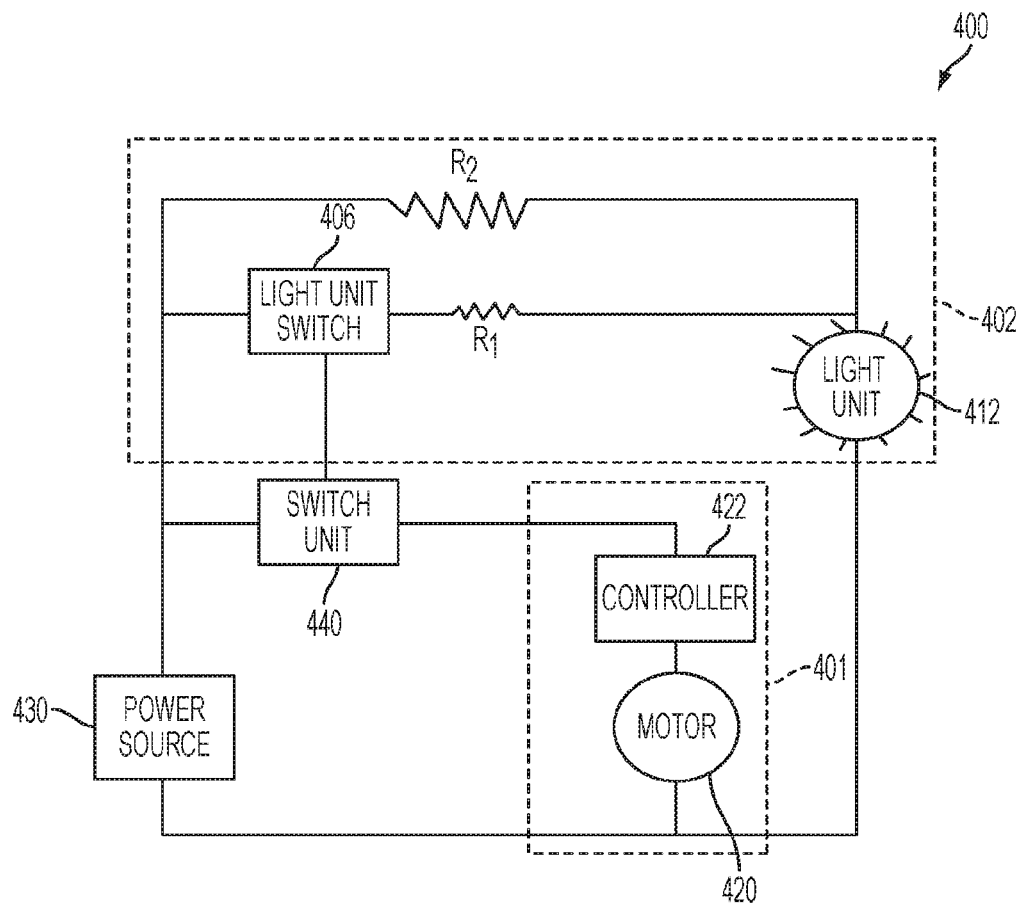
FIG. 4 is schematic view of a first embodiment of a power tool circuit that includes a light unit control circuit and a motor control circuit.

FIG. 4 illustrates one exemplary embodiment of a control circuit 400 for a power tool having a power source 430, a motor 420, a light unit 412, and a switch unit 440. The switch unit 440 selectively connects the motor 420 to the power source 430 via a motor control circuit 401, and selectively connects the light unit 412 to the power source 430 via a light unit control circuit 402. Actuation and operation of the switch unit 412 by the user of the power tool controls operation of the motor 420 and the light unit 412.

The power source 430 may be any suitable type of electrical power source, such as a direct current (DC) battery or alternating current (AC), e.g., from a wall outlet. In addition, or in the alternative, the power source 430 may include components or circuitry (not shown) to convert a DC power source to an AC signal, and vice versa, by means known in the art. The motor 420 may be any suitable type of motor that rotates when power is applied from the power source, such as a universal motor, a brushed DC motor, an AC motor, or a brushless motor. The light unit may include one or more of any type of suitable light source, such as one or more incandescent bulbs, fluorescent bulbs, or LEDs, connected to one another in series and/or in parallel.

The switch unit 440 comprises any type of switch that can be actuated by the user to selectively connect the power source 430 to the motor control circuit 401 and/or the light unit control circuit 402. For example, the switch unit may include an on-off button coupled to the housing that is coupled to one or more make-or-break switches or an electronic switches (e.g., a transistor, a triac, etc.) in the switch unit, for connecting the power source to the motor control circuit and for connecting the power source to the light unit control circuit. Alternatively, the switch unit may include a variably displaceable button on the housing, such as the trigger 30 or trigger 330 that variably controls an amount of power delivered to the motor. Such a trigger may be coupled to a make-or-break or electronic switch for connecting the power source to the light unit circuit and the motor control circuit, and/or to a potentiometer or another type of electronic switch sensor that senses the position of the trigger and enables the controller to control the amount of power to be delivered to the motor based upon the trigger position. Such a switch unit is described in the aforementioned U.S. Provisional Application No. 61/321,699, to which this application claims priority. In one particular embodiment, the switch unit 440 may comprise two separate buttons or switches on the housing that are connected to two separate make-or-break or electronic switches, one of which connects the power source to the light unit control circuit 402 and the other of which connects to the power source to the motor control circuit. Of course, other types and configurations of switch units are within the scope of the invention, as will be appreciated by one of ordinary skill in the art.

The motor control circuit 401 contains a controller 422 (e.g., a microprocessor, an open or closed loop feedback circuit, and/or a pulse width modulation (PWM control circuit) that controls the amount of power delivery to the motor 420. The controller 422 controls the amount of power delivered to the motor based on factors such as switch unit position 440, power from the power source 430, motor speed, output torque, etc.

The light unit control circuit 402 comprises a light unit switch 406, a first resistor R1 and the light unit 412 connected to the power source 430 in series, and a second resistor R2 connected to the light unit 412 and the power source 430 in parallel with the light switch unit 406 and first resistor R1. The resistance of resistor R2 is greater than the resistance of the resistor R1 (e.g. approximately 100 to 1000 times greater). For example, resistor R1 can have a resistance of approximately 700Ω, while resistor R2 can have a resistance of approximately 700 kΩ.

The light unit switch 406 is also connected to the switch unit 440 to cause the light switch unit 406 to close or open when the switch unit 440 is activated or released. For example, the light switch unit may comprise a transistor with the switch unit 440 connected to the gate of the transistor such that current flows through the transistor only when the switch unit is activated. For example, the light unit switch 406 can be an NPN, PNP, nFET, pFET, triac, diac, or other type of transistor or electronic switch, or an electromechanical relay switch, as will be understood to one having ordinary skill in the art.

When the switch unit 440 is activated, this causes the light unit switch 406 to close and current to flow primarily through the first resistor R1 to the light unit 412 (i.e., the path of least resistance). Since the resistance of resistor R1 is relatively small, there is little loss across resistor R1 so that the light unit 412 illuminates at a first brightness that is relatively bright. When the switch unit is not actuated 440, this causes the light unit switch 406 to open, which causes the current to flow only through the second resistor R2 to the light unit 412. Because the resistance of resistor R2 is much greater than R1, there are greater losses across resistor R2 and the light unit 412 is illuminates at a second brightness that is much lower or dimmer than the first brightness. In this manner, the power tool light unit illuminates brightly when the switch unit is activated and dimly when the switch unit is released. For example, the light unit brightness at the first brightness could be approximately ten times the brightness at the second brightness. In one possible embodiment, the light unit could be an LED with a first brightness of approximately 5 lumens and a second brightness of approximately 0.5 lumens.

Figure 5:
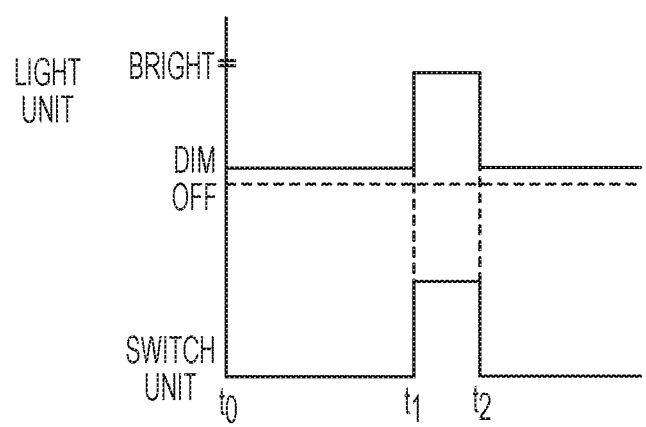
FIG. 5 is a timing diagram showing operation of the light unit control circuit of FIG. 4.

FIG. 5 is a timing diagram showing the operation of the control circuit of FIG. 4. At time t0, the switch unit is deactivated, and the light unit illuminates at the second, dim brightness level. At time t1, the switch unit is activated, and the light unit illuminates at the first, higher brightness level. At time t2, the switch unit is deactivated, and the light unit again illuminates at the second, dim brightness level.

Figure 6:
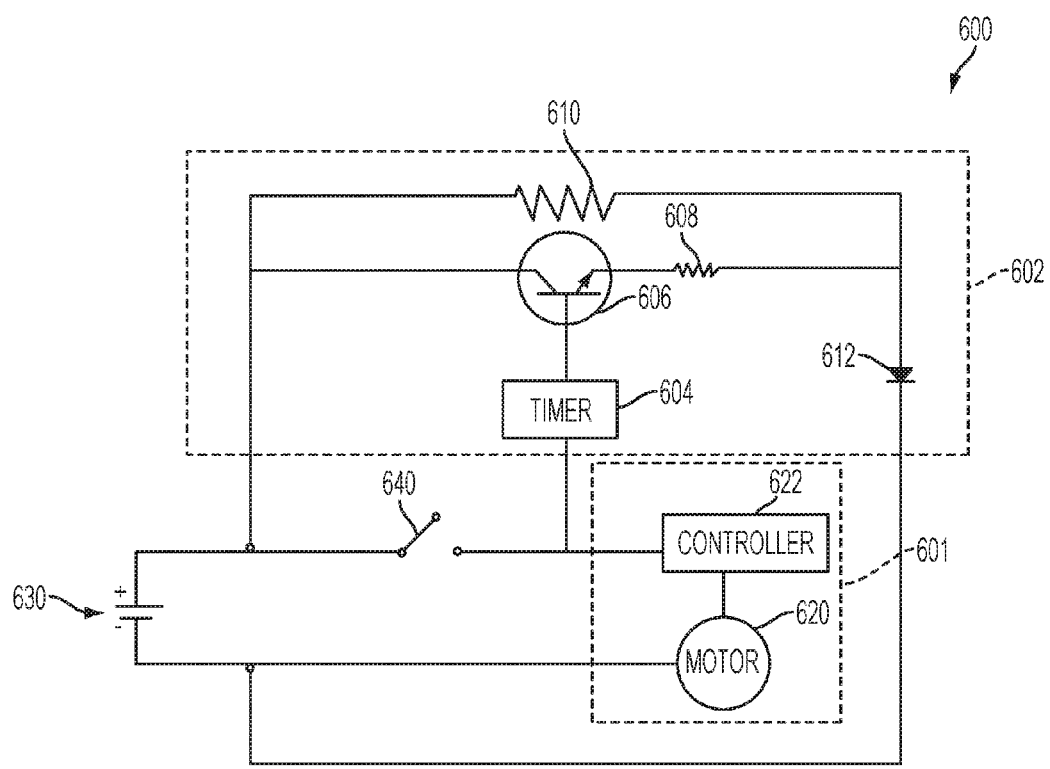
FIG. 6 is a schematic view of a second embodiment of a power tool circuit that includes a light unit control circuit and a motor control circuit.

FIG. 6 illustrates another exemplary embodiment a control circuit 600 for a power tool baying a power source 630 and a switch unit 640 that are configured similarly to the power source 430 and switch unit 440 of FIG. 4. In the embodiment of FIG. 6, the power source 630 is a DC battery (e.g., a battery rated at approximately 18V and approximately 2.4 amp hours) and the switch unit 640 is a single-stage contact switch, but it should be understood that the power source and switch unit can have any of the implementations described with respect to FIG. 4.

The switch unit 640 is connected to a motor control circuit 601 having a motor 620 and controller 622 that are configured the same as the motor control circuit 401 of FIG. 4. It should be understood that motor control circuit 601 and its components can have any of the implementations of the motor control circuit 401 and its components as described with respect to FIG. 4.

The switch is also connected to a light unit control circuit 602 having a light switch in the form of a transistor 606 (e.g. an NPN, PNP, nFET, or pFET transistor), a first resistor 608 having a small resistance (e.g. approximately 700Ω), a light unit in the form of an LED 612 (e.g., a 20 mA LED) and a second resistor 610 having a resistance much greater (e.g., approximately 100 to 1000 times greater) than the first resistor 608 (e.g., approximately 700 kΩ), that are arranged the same and correspond to the light unit switch 406, the first resistor R1, the light unit 412, and the second resistor R2 of FIG. 4. It should be understood that the light unit control circuit 602 and its components can have any similar implementations to the light unit control circuit 402 and its analogous components as described with respect to FIG. 4.

The light unit control circuit 602 differs from the light unit control circuit 402 in that it also includes a timer 604 that is disposed between the switch unit 640 and the gate of the transistor 606. The timer 604 controls the opening and closing of the transistor 606 so that current flows through the transistor 606 for a predetermined time either after the switch 640 has closed or after the switch 640 has opened. When the timer 604 is biasing the gate of the transistor 606, current will flow mainly through the first resistor 608 (the path of least resistance) and through the LED 612, so that the LED 612 will illuminate at a first, high brightness level (e.g., approximately 5 lumens). When the timer 604 has expired, the timer will no longer bias the gate of the transistor 606, and current will no longer flow through the first resistor 608, but will instead flow only through the second resistor 610. By selecting a resistance for the second resistor 610 that is large enough, only a small current will flow through the tool LED 612 thereby illuminating the LED 612 at a second brightness level (e.g. approximately 0.5 lumens) that is substantially lower than the first brightness level.

The timer 604 shown in FIG. 6 may comprise a microcontroller or processor having a time that is programmed so that the timer starts either upon the switch 640 being activated or upon the switch 640 being released or deactivated. Since the switch 640 also controls operation of the controller 622, the timer 604 can be incorporated into the controller 622. It should also be understood that the timer 604 may be connected to a separate switch connected to the power source 630 other than the switch 640 so that the timer operates independently of switch 640.

Figure 7A:
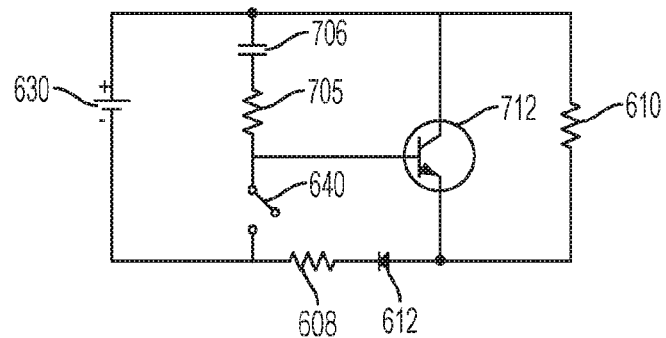
FIG. 7A is a schematic view of a an analog embodiment of the light unit control circuit of FIG. 6.
Figure 7B:
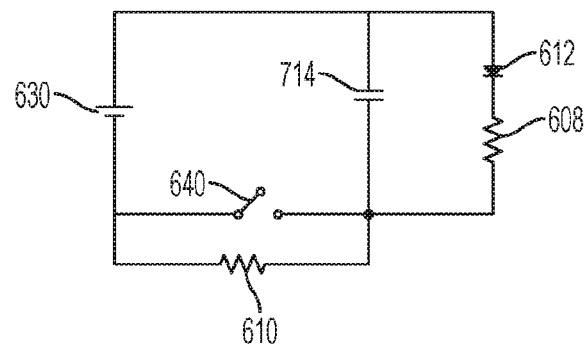
FIG. 7B is a schematic view of another analog embodiment of the light unit control circuit of FIG. 6.
Figure 7C:
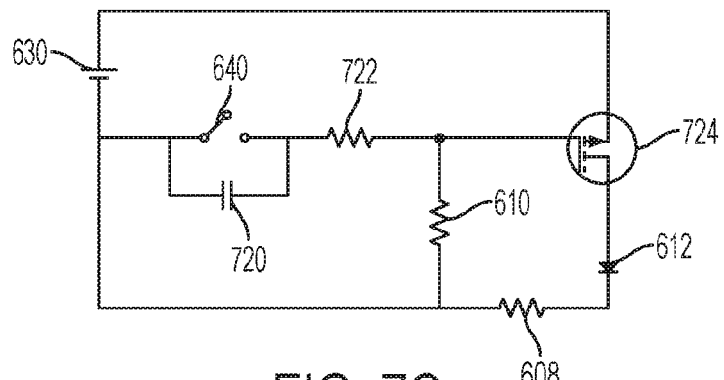
FIG. 7C is a schematic view of a yet another analog embodiment of the light unit control circuit of FIG. 6.
Figure 8:
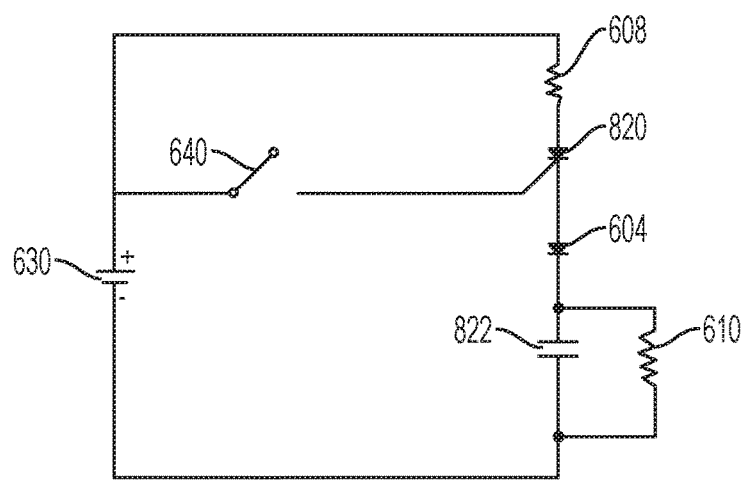
FIG. 8 is a schematic view of another analog embodiment of the light unit control circuit of FIG. 6.

The timer 604 may also comprise an analog timer circuit. For example, FIGS. 7A-7C illustrate three embodiments of analog timer circuits that have a timer that starts upon release or deactivation of the switch unit 604, while FIG. 8 illustrates an embodiment of an analog timer circuit that has a timer that starts upon activation of the switch unit 604. In FIGS. 7A-7C and 8, elements that are common to the embodiment of FIG. 6 have been given the same reference number. Those elements include the battery 630, the switch unit 640, the LED 612, the first smaller resistor 608, and the second, larger resistor 610.

In FIG. 7A, the light unit switch comprises a transistor 712 with a gate that is biased when the switch 640 is closed so that current flows mainly through the LED 612 and the first resistor 608 so that the LED 612 is illuminated at the first higher brightness level. Further, a capacitor 706 is charged during the period when the switch 640 is closed. Once the switch 640 is opened, the capacitor 706 will discharge, and continue to bias the gate of the transistor 712 so that the LED 612 continues to illuminate at the first higher brightness level. The duration of the timer is dependent on the values of the capacitor 706 and a resistor 705 connected in series the capacitor 706, as will be understood to one of ordinary skill in the art. For example, the capacitor 706 can have a capacitance of approximately 1 µF, while the resistor 705 can have a resistance of approximately 22 kΩ. Once the capacitor 706 is discharged, the gate of the transistor 712 will no longer be biased, and current will flow to the LED 612 through the second larger resistor 610, where the resistance of the resistor 610 is much greater than the resistance of the resistor 608 (e.g., 100 to 1000 times greater). When the current flows through the resistor 610, the LED 612 illuminates at the second brightness level that is substantially lower than the first brightness level.

In FIG. 7B, the circuit is designed so that the light unit switch and the switch unit 640 are one in the same. When the switch 640 is actuated or closed, current will flow from the battery 630 to the LED 612, mainly via the first smaller resistor 608 and the switch 640, largely bypassing second larger resistor 610 that is in parallel with the switch 640, so that the LED 612 illuminates at a first higher brightness level. At the same time, a capacitor 714 is charged. When the switch 640 is opened or released, the current will flow from the positive plate of a capacitor 714 through the LED 612 and first resistor 608 and back to the negative plate of the capacitor 714. The capacitor 714 has a very high capacitance such that the capacitor 714 powers the LED 612 when the switch 640 is opened. The duration of the timer is dependent on the selected value of the capacitor 714. For example, the capacitor 714 can have a capacitance of approximately 20 mF. Once the capacitor 714 is discharged, the current will flow from the battery 630 to the LED 612, via the first smaller resistor 608 and the second larger resistor 610. Because the resistance of the resistor 610 is very high in comparison to that of the resistor 608, the LED will illuminate at a second brightness level that is substantially less than the first brightness level.

In FIG. 7C, the light unit switch is a positive junction or MOFSET transistor 724 interposed between the LED 612 and the battery 630, such that a current always flows through the transistor 724. When the switch 640 is closed, the gate of the transistor 724 is biased and the fill current flows through the LED 612 and the first smaller resistor 608 such that the LED illuminates at a first higher brightness level, while a capacitor 720 is also charged. Once the switch 640 is opened, the capacitor 720 is discharged. While the capacitor 720 is discharging, the gate of the transistor 724 will remain biased until the capacitor 720 is discharged such that the LED continue to illuminate at the first brightness level. Once the capacitor 720 is discharged, the transistor 724 operates in a linear region to limit the current flowing through it, such that current flows to the LED 612 mainly via the second larger resistor 610. The duration of the timer depends on the capacitance of the capacitor 720 and the resistance of a resistor 722. For example, the capacitor 720 can have a capacitance of approximately 1 µF, while the resistor 722 can have a resistance of approximately 2.2 kΩ. The resistance of the second resistor 610 is much greater than the resistance of the first resistor 608 (e.g., 100 to 1000 times greater) such that the LED illuminates at a second brightness level that is substantially less than the first brightness level.

FIG. 8 illustrates an embodiment of an analog timer circuit that has a timer that starts upon activation of the switch unit 640 to cause the LED 604 to illuminate at the first higher brightness level. In this embodiment, the light unit switch is a thyristor 820 that continues to conduct current once a sufficient voltage is applied to the gate, even after the voltage applied to the gate is removed. The positive terminal of the battery 630 is connected to the LED 604 by the first smaller resistor 608 and the thyristor 820 wired in series with each other. The negative terminal of the battery 630 is connected to the LED 604 by a capacitor 822 and the second larger resistor 610 wired in parallel with each other. The positive terminal of the battery is also connected to the gate of the thyristor 820. When the switch unit 640 is closed, the thyristor 820 becomes conductive, such the current flows substantially through the first smaller resistor 608, the thyristor 820, the LED 604, and the capacitor 822, which illuminates the LED at the first higher brightness level, and current will continue to flow through the thyristor even if the switch unit 640 is opened. Once the capacitor has become fully charged (i.e., the timer expires), its effective resistance becomes infinite, and the current now flows through the first smaller resistor 608, the thyristor 820, the LED 604, and the second larger resistor 610, such that the LED now illuminates at the second lower brightness level.

Figure 9A:
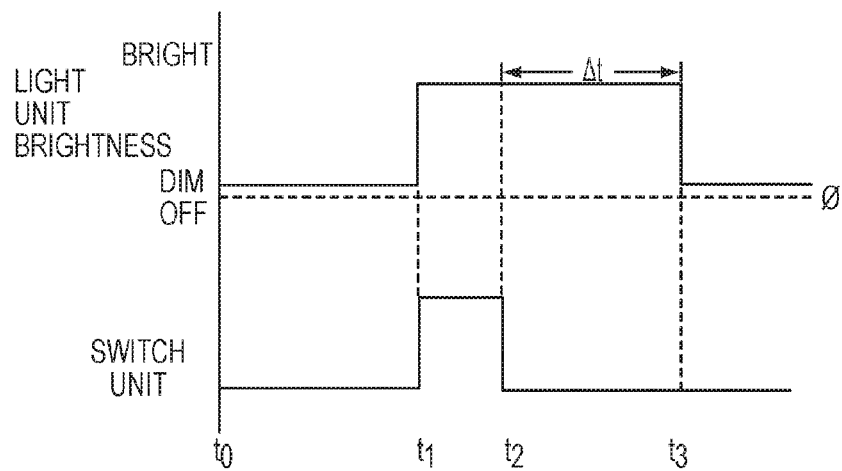
FIG. 9A is a timing diagram showing operation of the light unit control circuits of FIGS. 6 and 7A-7C.

FIG. 9A is a timing diagram that shows an example of operation of the switch unit 640 and light unit 612 where the timer starts upon deactivation or release of the switch 640, as illustrated in FIGS. 6 and 7A-7C. At time t0, the switch is deactivated, and the LED illuminates at the second lower brightness level. At time t1, the switch is activated, and the LED illuminates at the first, higher brightness level. At time t2, the switch is deactivated, and the timer starts to maintain the LED illumination at the first higher brightness level for a duration Δt. At time t3, the timer duration Δt expires, and the LED returns to being illuminated at the second lower brightness level.

Figure 9B:
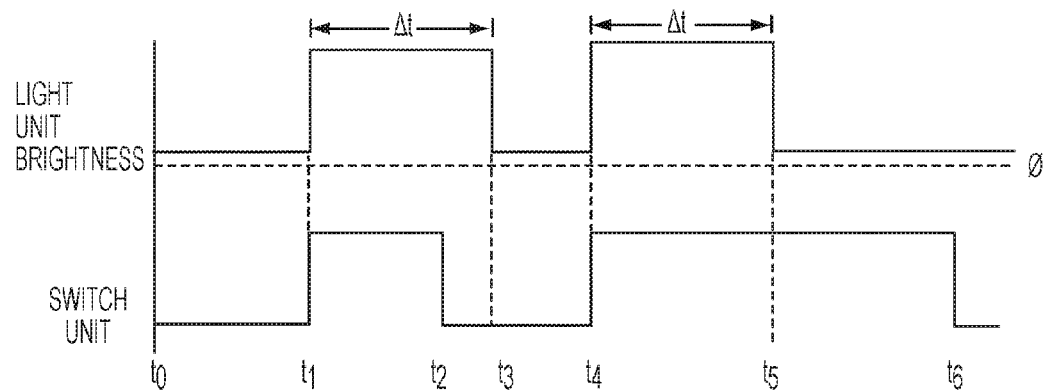
FIG. 9B is a timing diagram showing operation of the light unit control circuits of FIGS. 6 and 8.

FIG. 9B is a timing diagram that shows an example of operation of the switch unit 640 and light unit 612 where the timer starts upon activation of the switch 640, as illustrated in FIGS. 6 and 8. At time t0, the switch is deactivated and the LED illuminates at the second lower brightness level. At time t1, the switch is activated, the LED illuminates at the first, higher brightness level, and the timer starts to maintain the LED illumination at the first, higher brightness level for a duration Δt. At time t2, the switch is deactivated, but the timer duration Δt has not expired, so the LED continues to illuminate at the first brightness level until the timer expires. At time t3, the timer expires, and the LED illuminates at the second lower brightness level. At time t4, the switch is again activated, and the LED illuminates at the first higher brightness level, while the timer again starts for a duration Δt. At time t5, the switch is still activated, but the timer duration Δt has expired, so that LED returns to being illuminated at the second lower brightness level. At time t6, the switch is deactivated, while the LED continues to be illuminated at the second lower brightness level.

Figure 10A:
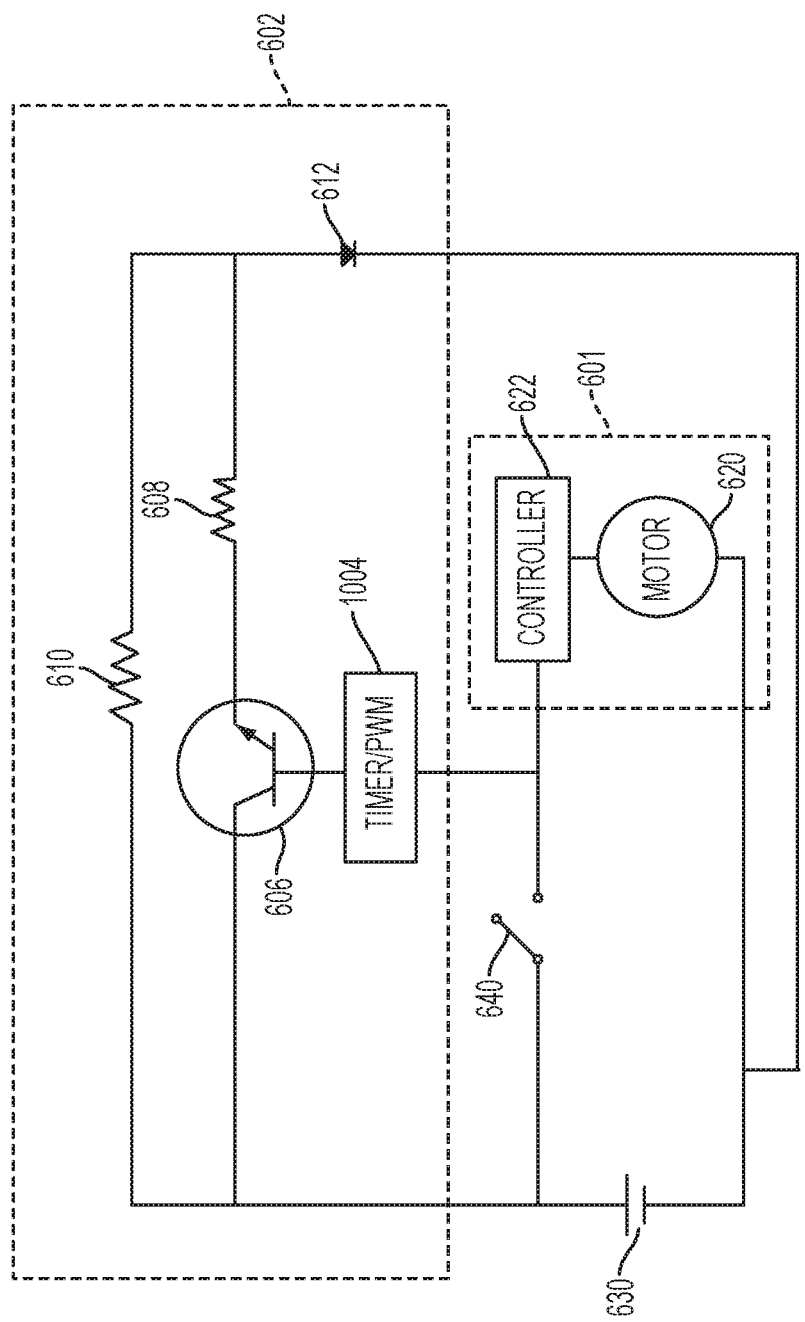
FIG. 10A is a schematic view of a third embodiment of a power tool circuit that includes a light unit control circuit and a motor control circuit.

FIG. 10A shows another embodiment of a light control circuit, similar to the one shown in FIG. 6, where like reference numerals show like components. FIG. 10 differs from FIG. 6 in that the timer 604 of FIG. 6 has been replaced with a timer and fader in the form of a timer/PWM module 1004. In this circuit, when the switch 640 is open, the current passes to the LED 612 through the second, larger resistor 610, so that the LED 612 is illuminated at the second, lower brightness level (e.g., approximately 0.5 lumens). When the switch 640 is closed, the timer/PWM module 1004 applies a pulse width modulation (PWM) voltage for a brief time to the gate of the transistor 606 so that the brightness of the LED gradually increases from the second brightness level to the first, higher brightness level (e.g., 5 lumens). While the switch 640 remains closed the timer/PWM module 1004 continues to apply a voltage to the gate of the transistor 606 so that current mainly flows to the LED 612 via the first smaller resistor 608, and the LED 612 continues to illuminate at the first, higher brightness level. When the switch 640 is opened or released, the timer/PWM continues to apply a full voltage to the gate of the transistor 608 for a predetermined period of time so that the LED remains ON at the first high brightness level. When the timer expires, the timer/PWM module 1004 applies a PWM voltage for a second predetermined period of time to the gate of the transistor 606 so that the brightness of the LED 612 gradually fades from the first brightness level to the second brightness level. The rate of the fade can be linear over time, or the rate can change over time, according to the programming of the timer/PWM module, as will be understood to those of ordinary skill in the art.

Figure 10B:
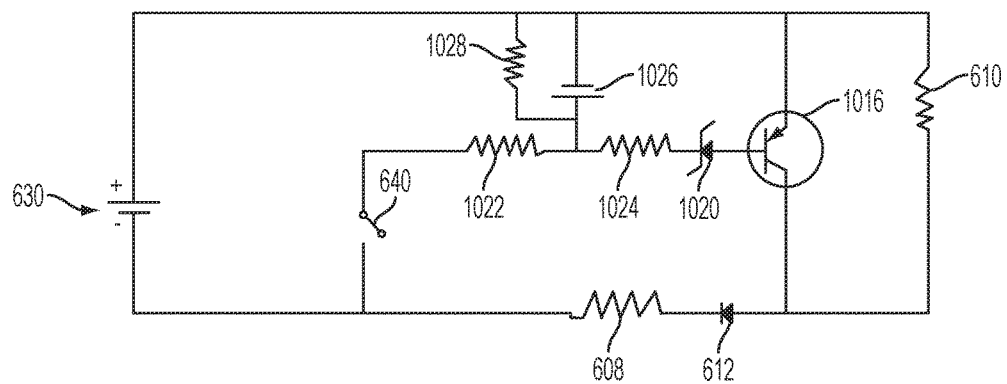
FIG. 10B is a schematic view of an analog embodiment of the light unit control circuit of FIG. 10A.

FIG. 10B shows an analog embodiment of the light control circuit of FIG. 10A that causes the light to gradually increase from the second brightness level to the first brightness level when the switch is actuated, and to gradually fade from the first high brightness level to the second lower brightness level after a timer expires. In FIG. 10B, elements that are common to the embodiment of FIG. 10 have been given the same reference number (i.e., the battery 630, switch 640, LED 612, first smaller resistor 608, and second larger resistor 610). The LED 612 is connected to the battery 630 in series by the first smaller resistor 608 and the second larger resistor 610. The circuit also includes a transistor 1016 with the switch unit 640 connected to the gate by a zener diode 1020 (e.g., a 5.1 V zener diode), and a third resistor 1022 (e.g. 5.1 kΩ), and a fourth resistor 1024 (e.g., 4 kΩ) connected in series. There is also a capacitor 1026 (e.g., 1000 μF) and a fifth resistor 1028 (e.g., 10 kΩ) in parallel between the positive terminal of the battery 630 and a node between the third and fourth resistors 1022, 1024.

Before the switch unit 640 is actuated (opened), current flows through the second larger resistor 610, the LED 612, and the first smaller resistor 608, so that the LED illuminates at the second lower brightness level. When the switch 640 is actuated (closed), a voltage applied to the gate of the transistor gradually increases as the capacitor 1026 charges, so that current flowing to the LED 612 gradually shifts to substantially bypassing the second larger resistor 610, causing the LED 612 to gradually increase in brightness to the first higher brightness level. When the switch is deactivated (opened), the capacitor 1026 discharges 1012 to keep voltage applied to the gate of the transistor 1016 for a predetermined period of time so that the LED 612 remains illuminated at the first brightness level before gradually fading to the second brightness level as current begins to flow through the second resistor 610.

Figure 11:
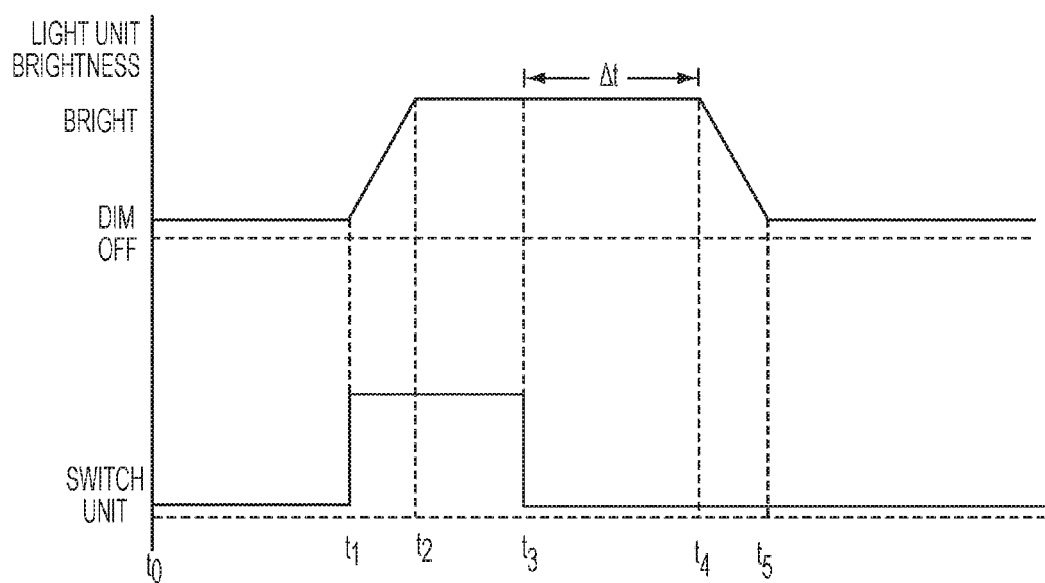
FIG. 11 is a timing diagram showing operation of the light unit control circuits of FIGS. 10A and 10B.

FIG. 11 is a timing diagram that that shows an example of operation of the switch unit and light unit where the timer starts upon deactivation or release of the switch and the light fades upon expiration of the timer, as illustrated in FIGS. 10A and 10B. At time t0, the switch is deactivated, and the LED illuminates at the second lower brightness level. At time t1, the switch is activated, and the LED gradually increases in brightness until time t2 when it becomes illuminated at the first, higher brightness level. At time t3, the switch is deactivated, and the timer maintains the LED illumination at the first higher brightness level form a duration Δt until time t4. At time t4, the LED brightness gradually fades from the first higher brightness level to the second lower brightness level at time t5.

Figure 12:
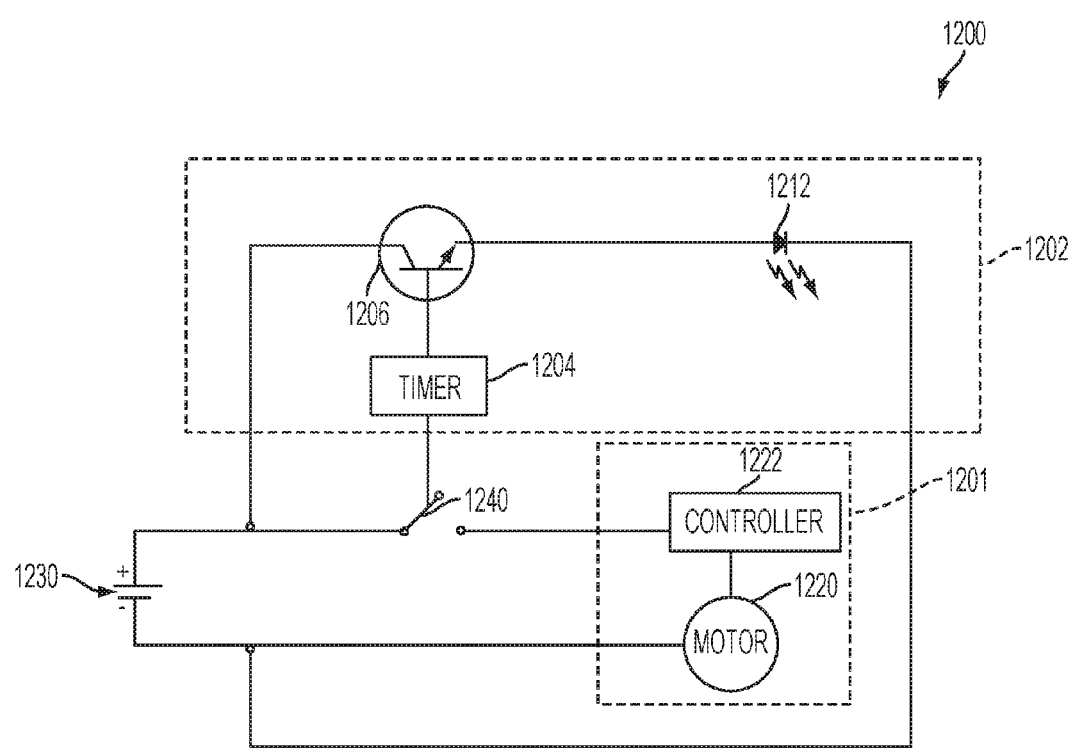
FIG. 12 is a schematic view of a fourth embodiment of a power tool circuit that includes a light unit control circuit and a motor control circuit.

FIG. 12 illustrates another exemplary embodiment of a control circuit 1200 for a power tool having a power source 1230 (e.g., a DC battery) and a switch unit 1240 that are configured similarly to the power source 430 and switch unit 440 of FIG. 4. It should be understood that the power source 1230 and the switch unit 1240 can have many other implementations, including those described with respect to FIG. 4.

The switch unit 1240 is connected to a motor control circuit 1201 having a motor 1220 and controller 1222 that are configured the same, as the motor control circuit 401 of FIG. 4. It should be understood that the components of the motor control circuit 1201 can have any of the implementations of the components of the motor control circuit 401 as described with respect to FIG. 4.

The switch unit 1240 is also connected to a light unit control circuit 1202 having a light switch in the form of a transistor 1206 (e.g., an NPN, PNP, nFET, or pFET transistor) connected in series between the battery 1230 (e.g., an 18V battery) and the light unit in the form of an LED 1212 (e.g., a 20 mA LED) and a second resistor 610 having a resistance (e.g., approximately 700 kΩ) much greater (e.g., 1000×) than the first resistor 608 (e.g., approximately 700Ω), that are arranged the same and correspond to the components of the light unit control circuit 402 of FIG. 4. The light unit control circuit 1202 also includes a timer 1204 that is disposed between the switch 1240 and the gate of the transistor 1206. It should be understood that the components of the light control circuit 602 can have any of the implementations of the components of the light control circuits 402 and 602 as described with respect to FIGS. 4 and 6.

The timer 1204 is connected to the gate of the transistor 1206 to control the opening and closing of the transistor 1206. When the timer 1204 is biasing the gate of the transistor 1206, current will flow through the LED 1212, so that the LED 1212 will illuminate. When the switch 1240 is open and the timer 1204 has expired, the timer 1204 will no longer bias the gate of the transistor 1206, and current will no longer flow through the LED 1212, so that the LED 1212 will not illuminate.

The timer 1204 shown in FIG. 12 may comprise a microcontroller or processor that is programmed so that the timer starts upon the switch 1240 being activated. The timer 1204 also senses the position of the switch unit 1240 (e.g., via a potentiometer, a Hall sensor, or some other means that may be a separate component or may be built into one of the timer or the switch). In one embodiment, the timer restarts itself every time that it senses that the position of the switch 1240 has been changed by a predetermined amount without being completely released or deactivated. In another embodiment, the timer restarts if the timer expires and the switch 1240 is still actuated when the timer expires, regardless of whether the switch has been deactivated in the interim. Since the switch 1240 also controls operation of the motor controller 1222, the timer can be incorporated into the motor controller 1222. It should also be understood that the timer 1204 may be connected to a separate switch connected to the power source 1230 other than the switch 1240 so that the timer operates independently of switch 1240. It is further envisioned that analog circuits can be used in place of a microprocessor. In addition, the circuit 1202 can include a fader in the form of a timer/PWM module like the one shown in FIG. 10.

Figure 13:
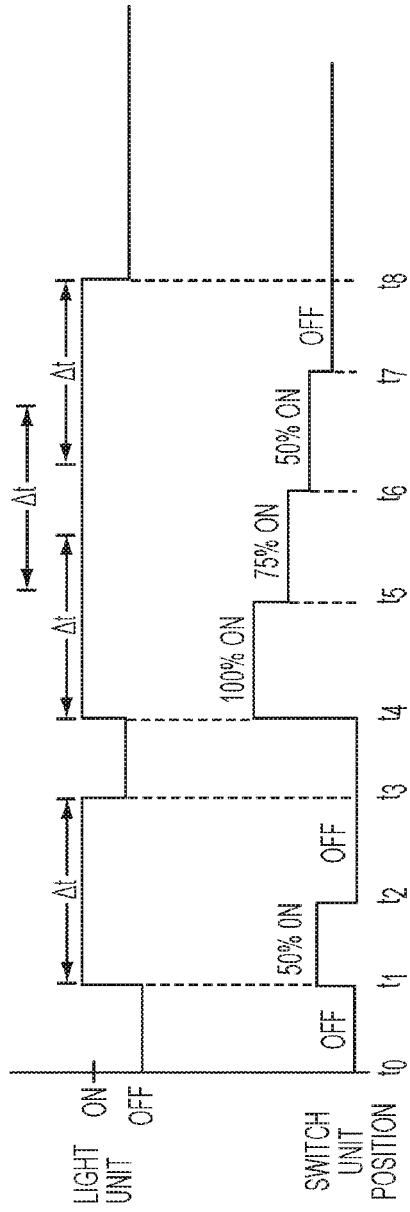
FIG. 13 is a timing diagram showing one embodiment of the operation of the light unit control circuit of FIG. 12.

FIG. 13 is a timing diagram that that shows an example of operation of the switch unit 1240 and light unit 1212 of FIG. 12, where the timer starts upon activation of the switch 1240 and resets every time the switch position is changed without the switch being released. At time t0, the switch is OFF, and the LED is OFF. At time t1, the switch is activated to 50%, the LED is turned ON, and the timer starts to keep the LED turned ON for a duration of Δt. At time t2, the switch is deactivated before expiration of the timer duration Δt, and the timer continues to keep the LED ON. At time t3, the switch is still deactivated, and the timer duration Δt expires, so that the LED turns OFF. At time t4, the switch is activated, to 100% ON, the LED is turned ON, and the timer starts to keep the LED ON for a duration Δt, At time t5, the switch position changes to 75% ON before expiration of the timer duration Δt, and the duration Δt of the timer restarts to keep the LED ON. At time t6, the switch position changes to 50% ON before expiration of the timer duration Δt, and the duration Δt of the timer restarts to keep the LED ON. At time t7, the switch is deactivated before expiration of the timer Δt, and the timer continues to keep the LED ON. At time t8, the timer duration Δt expires, and the LED turns OFF.

Figure 14:
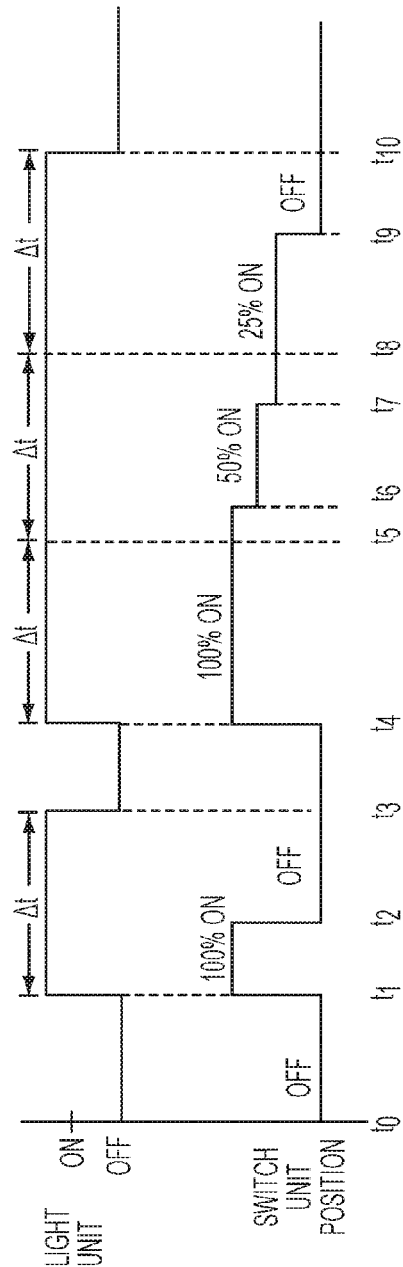
FIG. 14 is a timing diagram showing another embodiment of the operation of the light unit control circuit of FIG. 12.

FIG. 14 is a timing diagram that that shows another example of operation of the switch unit 1240 and light unit 1212 of FIG. 12, where the timer starts upon activation of the switch 1240 and resets if the switch 1240 remains in the ON state when the timer duration Δt expires. At time t0, the switch is OFF, and the LED is OFF. At time t1, the switch is activated to 100% ON, the LED is turned ON, and the timer starts to keep the LED turned ON for a duration of Δt. At time t2, the switch is deactivated before expiration of the timer duration Δt, and the timer continues to keep the LED ON. At time t3, the switch is still deactivated, and the timer duration Δt expires, so that the LED turns OFF. At time t4, the switch is activated to 100% ON, the LED is turned ON, and the timer starts to keep the LED ON for a duration Δt. At time t5, the duration Δt of the timer expires, while the switch remains at 100% ON so the timer resets for another duration Δt keeping the LED ON. At time t6, the switch position changes to 50% ON before expiration of the timer duration Δt, and LED stays ON. At time t7, the switch position changes to 25% ON before expiration of the timer duration Δt, and the LED stays ON. At time t8, the timer duration Δt expires while the switch remains at 25% ON, so the timer again resets to continue to keep the LED ON for another duration Δt. At time t9, the switch is deactivated before expiration of the timer Δt, and the timer continues to keep the LED ON. At time t10, the timer duration Δt expires, while the switch is OFF, so the LED turns OFF.

Figure 15:
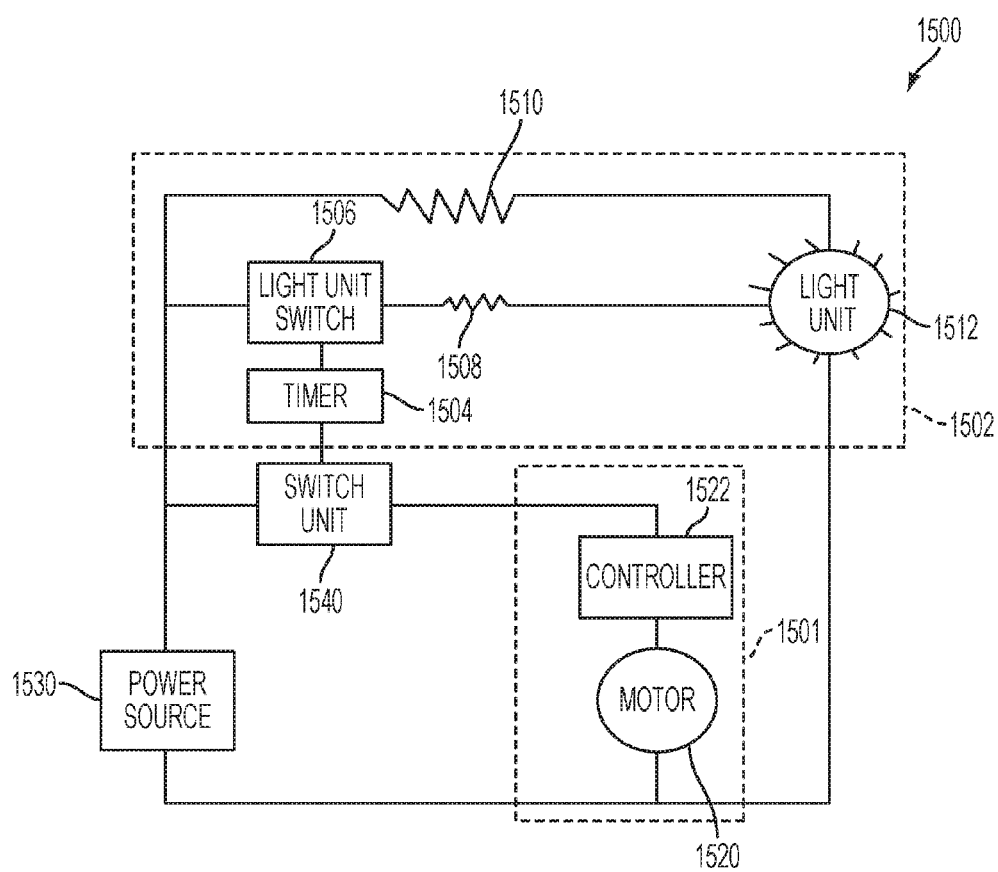
FIG. 15 is a schematic diagram showing a fifth embodiment of a power tool circuit that includes a light unit control circuit and a motor control circuit.

FIG. 15 illustrates a tool circuit 1500 for a power tool having a power source 1230 and a switch unit 1240 that combines features of the tool circuit 400 of FIG. 4 and features of the tool circuit 1200 of FIG. 12. The tool circuit 1500 of FIG. 15 causes the light unit to illuminate at first higher brightness level when the switch unit is activated and keeps the light unit illuminated at that level for a predetermined time duration after the switch unit is activated, where the time duration resets if the switch unit position changes without being deactivated and/or if the switch unit is not deactivated when the timer duration expires. When the timer expires and the switch unit is not activated, the circuit causes the light unit to illuminate at a second lower brightness level.

The power source 1530 and the switch unit 1540 can have any of the implementations of the power source 430 and switch unit 440 described with respect to FIG. 4. The switch 1540 is connected to a motor control circuit 1501 having a motor 1520 and controller 1522 that are configured the same as the motor control circuit 401 of FIG. 4. It should be understood that the components of the motor control circuit 1501 can have any of the implementations of the components of the motor control circuit 401 as described with respect to FIG. 4.

The switch unit 1540 is also connected to a light unit control circuit 1502 having a light switch (e.g., a transistor) 1506, a first resistor 1508 having a small resistance (e.g., approximately 700Ω), a light unit (e.g., an LED) 1502 and a second resistor 1510 having a resistance (e.g., 700 kΩ) that is much greater (e.g., 100 to 1000 times greater) than the first resistor 1508, that are arranged the same and correspond to the components of the light unit control circuit 402 of FIG. 4. It should be understood that these components of the light control circuit 1502 can have any of the implementations of the components of the light control circuit 402 as described with respect to FIG. 4.

The light unit control circuit 1502 also includes a timer 1504 disposed between the switch unit 640 and the gate of the light unit switch 1506. The timer 1504 controls the opening and closing of the light unit switch 1506 so that current flows through the light unit switch 1506 for a predetermined time after the switch 1540 has been activated. When the timer 1504 is biasing the gate of the light unit switch 1506, current will flow mainly through the first resistor 1508 (the path of least resistance) and through the light unit 1512, so that the light unit 1512 will illuminate at a first, high brightness level. When the timer 1504 has expired, the timer will no longer bias the gate of the light unit switch 1506, and current will no longer flow through the first resistor 1508, but will instead flow only through the second resistor 1510. By selecting a resistance for the second resistor 1510 that is large enough (e.g., approximately 100 to 1000 times larger than the first resistor 1508), only a small current will flow through the light unit 1512 thereby illuminating the light unit 1512 at a second brightness level that is substantially lower than the first brightness level.

The timer 1504 shown in FIG. 15 may comprise a microcontroller or processor that is programmed so that the timer starts upon the switch 1540 being activated. The timer 1504 also senses the position of the switch 1240 (e.g., through a potentiometer, a Hall sensor, or some other means that may be a separate component or may be built into one of the timer or the switch). In one embodiment, the timer restarts itself every time that it senses that the position of the switch 1540 has been changed by a predetermined amount without being completely released or deactivated. In another embodiment, the timer restarts if the timer expires and the switch 1540 is still actuated when the timer expires, regardless of whether the switch has been deactivated in the interim. Since the switch 1540 also controls operation of the motor controller 1522, the timer can be incorporated into the motor controller 1522. It should also be understood that the timer 1504 may be connected to a separate switch connected to the power source 1530 other than the switch 1540 so that the timer operates independently of switch 1540. It is further envisioned that analog circuits can be used in place of a microprocessor. In addition, the circuit 1502 can include a fader like the one shown in FIG. 10.

FIG. 16 is a tinting diagram that that shows an example of operation of the switch unit 1540 and light unit 1512 of FIG. 15, where the timer starts upon activation of the switch 1540 and resets every time the switch position is changed without the switch being released. At time t0, the switch is OFF, and the light unit is at a LOW brightness. At time t1, the switch is activated to 50%, the light unit is at a HIGH brightness, and the timer starts to keep the light unit at the HIGH brightness for a duration of Δt. At time t2, the switch is deactivated before expiration of the timer duration Δt, and the timer continues to keep the light unit at the HIGH brightness. At time t3, the switch is still deactivated, and the timer duration Δt expires, so that the light unit switches to a LOW brightness. At time t4, the switch is activated to 100% ON, the light unit switches to a HIGH brightness, and the timer starts to keep the light unit at the HIGH brightness for a duration Δt. At time t5, the switch position changes to 75% ON before expiration of the timer duration Δt, and the duration Δt of the timer restarts to keep the light unit at the HIGH brightness. At time t6, the switch position changes to 50% ON before expiration of the timer duration Δt, and the duration Δt of the timer restarts to keep the light unit at the HIGH brightness. At time t7, the switch is deactivated before expiration of the timer Δt, and the timer continues to keep the light unit at the HIGH brightness. At time t8, the timer duration Δt expires, and the light unit switches to the LOW brightness.

FIG. 14 is a timing diagram that that shows another example of operation of the switch unit 1540 and light unit 1512 of FIG. 12, where the timer starts upon activation of the switch 1540 and resets if the switch 1540 remains in the ON state when the timer duration Δt expires. At time t0, the switch is OFF, and the light unit at a LOW brightness. At time t1 the switch is activated to 100% ON, the light unit switches to a HIGH brightness, and the timer starts, to keep the light unit at the HIGH brightness for a duration of Δt. At time t2, the switch is deactivated before expiration of the timer duration Δt, and the timer continues to keep the light unit at the HIGH brightness. At time t3, the switch is still deactivated, and the timer duration Δt expires, so that the light unit switches to the LOW brightness. At time t4, the switch is activated to 100% ON, the light unit is switched to the HIGH brightness, and the tinier starts, to keep the light unit at the HIGH brightness for a duration Δt, At time t5, the duration Δt, of the timer expires, while the switch remains at 100% ON so the timer resets for another duration Δt keeping the light unit at the HIGH brightness. At time t6, the switch position changes to 50% ON before expiration of the tinier duration Δt, and light unit stays at the HIGH brightness. At time t7, the switch position changes to 25% ON before expiration of the timer duration Δt, and the light unit stays at the HIGH brightness. At time t8, the timer duration Δt expires while the switch remains at 25% ON, so the timer again resets to continue to keep the light unit at the HIGH brightness for another duration Δt. At time t9, the switch is deactivated before expiration of the timer Δt, and the timer continues to keep the light unit at HIGH brightness. At time t10, the timer duration Δt expires, while the switch is OFF, so the light unit switches to LOW brightness.

Numerous modifications may be made to the exemplary implementations described above. These and other implementations are within the scope of the following claims.

What is claimed is:

1. A power tool comprising:
   a housing;
   a motor contained in the housing and connectable to an electrical power supply;
   a motor control circuit configured to control operation of the motor;
   a light unit coupled to the housing and configured to illuminate a work area, the light unit connectable to the electrical power supply;
   a light unit control circuit configured to control illumination of the light unit; and
   a switch unit coupled to the housing and selectively operable by the user to control operation of the motor control circuit and the light unit control circuit;
   wherein the motor control circuit is configured to initiate operation of the motor the switch unit is actuated to an ON state, to maintain operation of the motor when the switch unit is maintained in the ON state, and to cease operation of the motor when the switch unit is deactivated to an OFF state; and
   wherein the light unit control circuit is configured to cause the light unit to begin illuminating when the switch unit is actuated to the ON state, to cause the light unit to remain illuminated for a first predetermined time period that starts upon actuation of the switch unit to the ON state, to cause the light unit to remain illuminated for a subsequent second predetermined time period when the switch unit remains in the ON state at the end of the first predetermined time period, and to cause the light unit to stop illuminating when the later of the first predetermined time period and the second predetermined time period ends.

2. The power tool of claim 1, wherein the light control circuit comprises a timer and a light unit switch coupled to the switch unit, so that the light unit switch closes to cause current to flow to the light unit when the switch unit is actuated, and that opens to prevent current from flowing to the light unit when the later of the first predetermined time period and the second predetermined time period ends.

3. The power tool of claim 2, wherein the light unit switch comprises one of an electronic switch or electromechanical switch that is closed by actuation of the switch unit.

4. The power tool of claim 2, wherein the timer is configured to cause the light unit switch to remain closed a predetermined amount of time after the switch unit is actuated.

5. The power tool of claim 2, wherein the timer comprises one of a microprocessor, a digital timer circuit or an analog timer circuit.

6. The power tool of claim 1, wherein the light unit control circuit includes a fader that causes the light unit to gradually fade from a first brightness level to a second brightness level when the later of the first predetermined time period and the second predetermined time period ends.

7. The power tool of claim 1, wherein the light unit control circuit causes the light unit to illuminate at a first brightness level other than an OFF state when the switch unit is in the ON state and at a second brightness level other than an OFF state that is less than the first brightness level when the switch unit is in the OFF state and the later of the first predetermined time period and the second predetermined time period ends.

8. The power tool of claim 1, wherein the switch unit comprises a trigger that can travel relative to the housing, and the light unit control circuit senses a position of the trigger and causes the later of the first predetermined time period and the second predetermined time period ends to restart when the position of the trigger changes without the trigger being deactivated to the OFF state.

9. A power tool comprising:
a housing;
a motor contained in the housing and connectable to an electrical power supply;
a motor control circuit configured to control operation of the motor;
a light unit coupled to the housing and configured to illuminate a work area, the light unit connectable to the electrical power supply;
a light unit control circuit configured to control illumination of the light unit; and
a switch unit coupled to the housing and selectively operable by the user to control operation of the motor control circuit and the light unit control circuit;
wherein the light unit control circuit includes a timer configured to cause the light unit to illuminate upon the switch unit being actuated to an ON state to initiate operation of the motor, and configured to cause the light unit to remain illuminated at the first brightness level for a predetermined time period that starts upon actuation of the switch unit to the ON state, wherein the timer restarts the predetermined time period when the switch unit is not deactivated to an OFF state to stop operation of the motor upon the end of the predetermined time period, and wherein the light unit control circuit causes the light unit to stop illuminating when the switch unit is deactivated and the predetermined time period has expired, such that the timer causes the light unit to remain illuminated for any remaining time in the predetermined time period upon the switch unit being deactivated to the OFF state.

10. The power tool of claim 9, wherein the timer comprises one of a microprocessor, a digital timer circuit or an analog timer circuit.

11. The power tool of claim 9, wherein the light unit control circuit includes a fader that causes the light unit to gradually fade in brightness from being illuminated to not being illuminated.

12. The power tool of claim 9, wherein the switch unit comprises a trigger that can travel relative to the housing, and the timer senses a position of the trigger and causes the predetermined time period to restart when the position of the trigger changes without the trigger being deactivated.

13. The power tool of claim 9, wherein the light control circuit comprises a light unit switch coupled to the switch unit, so that the light unit switch closes to cause current to flow to the light unit when the switch unit is actuated, and that opens to prevent current from flowing to the light unit when the predetermined time period expires and the switch unit is in the OFF state.

14. The power tool of claim 13, wherein the light unit switch comprises one of an electronic switch or electromechanical switch that is closed by actuation of the switch unit.

15. The power tool of claim 13, wherein the timer is configured to cause the light unit switch to remain closed a predetermined amount of time after the switch unit is actuated.

* * * * *